(12) United States Patent
Matsumoto

(10) Patent No.: US 11,637,091 B2
(45) Date of Patent: Apr. 25, 2023

(54) RADIO-FREQUENCY MODULE AND COMMUNICATION APPARATUS

(71) Applicant: Murata Manufacturing Co., Ltd., Nagaokakyo (JP)

(72) Inventor: Sho Matsumoto, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 17/749,136

(22) Filed: May 20, 2022

(65) Prior Publication Data

US 2022/0278080 A1 Sep. 1, 2022

Related U.S. Application Data

(63) Continuation of application No. 17/023,410, filed on Sep. 17, 2020, now Pat. No. 11,380,654, which is a
(Continued)

(30) Foreign Application Priority Data

Mar. 23, 2018 (JP) .............................. JP2018-057103

(51) Int. Cl.
*H03F 3/195* (2006.01)
*H05K 1/02* (2006.01)
(Continued)

(52) U.S. Cl.
CPC ........... *H01L 25/0657* (2013.01); *H03F 1/56* (2013.01); *H03F 3/245* (2013.01); *H04B 1/40* (2013.01);
(Continued)

(58) Field of Classification Search
None
See application file for complete search history.

(56) References Cited

U.S. PATENT DOCUMENTS 6,777,787 B2 * 8/2004 Shibata ................. H01L 25/105
257/666
6,815,254 B2 * 11/2004 Mistry .................... H01L 21/56
257/685
(Continued)

FOREIGN PATENT DOCUMENTS

JP 2004-327604 A 11/2004
JP 2005-150443 A 6/2005
(Continued)

OTHER PUBLICATIONS

International Search Report and Written Opinion dated May 14, 2019 for PCT/JP2019/009579 filed on Mar. 11, 2019, 8 pages.
(Continued)

*Primary Examiner* — Tuan A Tran
(74) *Attorney, Agent, or Firm* — Xsensus LLP

(57) ABSTRACT

A radio-frequency module including a mounting substrate that has mounting faces opposed to each other; a PA that is mounted on the mounting face, that is a radio-frequency component, and that has an emitter terminal; a through electrode that is connected to the emitter terminal of the PA and that passes through the mounting faces of the mounting substrate; and a ground terminal connected to the through electrode.

18 Claims, 7 Drawing Sheets

Related U.S. Application Data continuation of application No. PCT/JP2019/009579, filed on Mar. 11, 2019.

(51) Int. Cl.

| | | |
|---|---|---|
| *H01L 23/48* | (2006.01) | |
| *H01L 23/488* | (2006.01) | |
| *H01L 25/065* | (2023.01) | |
| *H03F 1/56* | (2006.01) | |
| *H03F 3/24* | (2006.01) | |
| *H04B 1/40* | (2015.01) | |

(52) U.S. Cl.
CPC ............... *H01L 2225/06517* (2013.01); *H01L 2225/06537* (2013.01); *H01L 2225/06548* (2013.01); *H01L 2225/06558* (2013.01); *H01L 2225/06586* (2013.01); *H01L 2225/06589* (2013.01); *H03F 2200/222* (2013.01); *H03F 2200/294* (2013.01); *H03F 2200/387* (2013.01); *H03F 2200/451* (2013.01)

(56) References Cited

U.S. PATENT DOCUMENTS

| | | | | |
|---|---|---|---|---|
| 7,205,647 | B2* | 4/2007 | Karnezos | H01L 23/3128 257/678 |
| 7,245,884 | B2* | 7/2007 | Oida | H01L 23/552 257/E23.114 |
| 7,389,570 | B2* | 6/2008 | Yokota | H03H 3/08 29/25.35 |
| 7,394,665 | B2* | 7/2008 | Hamasaki | H05K 7/1092 361/803 |
| 7,569,925 | B2* | 8/2009 | Nishizawa | H01L 23/13 257/700 |
| 7,829,989 | B2* | 11/2010 | Sun | H01L 23/5389 257/686 |
| 8,022,523 | B2* | 9/2011 | Chen | H01L 25/0657 257/686 |
| 8,124,453 | B2* | 2/2012 | Sun | H01L 23/3677 438/109 |
| 8,247,898 | B2* | 8/2012 | Ono | H01L 21/561 257/690 |
| 8,373,997 | B2* | 2/2013 | Kobayashi | H01L 23/49816 361/783 |
| 8,952,262 | B2* | 2/2015 | Yamashita | H05K 1/185 174/260 |
| 9,166,765 | B2* | 10/2015 | Nakamura | H05K 1/0237 |
| 9,362,235 | B2* | 6/2016 | Kim | H01L 25/0657 |
| 9,905,482 | B2* | 2/2018 | Ishii | H01L 22/14 |
| 2005/0001301 | A1* | 1/2005 | Aoyagi | H01L 24/32 257/686 |
| 2005/0258452 | A1 | 11/2005 | Konishi et al. | |
| 2006/0001179 | A1* | 1/2006 | Fukase | H01L 23/49827 257/778 |
| 2006/0128322 | A1 | 6/2006 | Igarashi et al. | |
| 2008/0067656 | A1* | 3/2008 | Leung | H01L 23/5385 257/686 |
| 2009/0194792 | A1* | 8/2009 | Konishi | H01L 25/16 257/197 |
| 2014/0133103 | A1* | 5/2014 | Nakamura | H05K 1/0207 361/712 |
| 2016/0035678 | A1* | 2/2016 | Yoo | H01L 21/78 257/659 |

FOREIGN PATENT DOCUMENTS

| | | |
|---|---|---|
| JP | 2005-327805 A | 11/2005 |
| JP | 2006-166277 A | 6/2006 |
| JP | 2011-14659 A | 1/2011 |
| JP | 2015-146333 A | 8/2015 |
| KR | 2016-0014913 A | 2/2016 |
| WO | 2005/078796 A1 | 8/2005 |
| WO | 2018/043162 A1 | 3/2018 |

OTHER PUBLICATIONS

English Translation of Written Opinion dated May 14, 2019 for PCT/JP2019/009579 filed on Mar. 11, 2019, 4 pages.
Office Action dated Apr. 17, 2022, in corresponding Korean patent Application No. 10-2020-7026865, 15 pages.

* cited by examiner

RADIO-FREQUENCY MODULE AND COMMUNICATION APPARATUS

CROSS-REFERENCE TO RELATED APPLICATIONS

The present application is a continuation of U.S. application Ser. No. 17/023,410, filed Sep. 17, 2020, which is a continuation application of PCT International Application No. PCT/JP2019/009579 filed on Mar. 11, 2019 designating the United States of America, which is based on and claims priority of Japanese Patent Application No. 2018-057103 filed on Mar. 23, 2018. The entire disclosures of the above-identified applications, including the specifications, drawings and claims are incorporated herein by reference in their entirety.

BACKGROUND

1. Field of the Disclosure

The present disclosure relates to a radio-frequency module and a communication apparatus.

2. Description of the Related Art

In mobile communication apparatuses, such as mobile phones, the number of circuit elements composing radio-frequency (RF) front end circuits are increasing particularly with development of multiband technologies.

International Publication No. 2005/078796 describes an electronic component (circuit module) in which circuit elements composing a radio-frequency front end circuit are mounted on both faces of a mounting substrate. Passive chip components are mounted on a second mounting face, among two mounting faces of a dual-side mounted core substrate, which are opposed to each other, and active chip components are mounted on a first mounting face opposite to the second mounting face. The second mounting face is at the side where external terminal electrodes are arranged. With the above configuration, the high-density and compact circuit module is capable of being provided, compared with a circuit module in which the circuit elements are formed on a single-side mounted substrate.

SUMMARY

When the circuit module disclosed in International Publication No. 2005/078796 is applied to a radio-frequency front end circuit, a transmission power amplifier that outputs a high-power radio-frequency signal is applied as an active chip component. In this case, for example, since high current flows through an emitter portion of the transmission power amplifier, it is necessary to ensure that a heat radiating unit from the circuit module to an external substrate is provided.

However, in the circuit module disclosed in International Publication No. 2005/078796, since the active chip components are mounted on the first mounting face opposite to the second mounting face on which the external substrate is mounted and a heat radiation path from the active chip components to the external substrate is not ensured, there is a problem in that heat radiation effect is degraded.

In addition, when the active chip components are mounted on the second mounting face, a heat radiation line through the active chip components, the second mounting face, a planar wiring pattern parallel to the mounting face of the core substrate, and the external terminal electrodes is required as the heat radiation path from the active chip components to the external substrate. However, in this case, since a high-resistance line path only through the planar wiring pattern is included in the heat radiation line, in addition to low-resistance via lines along a direction vertical to the mounting face, and thermal resistance is increased on the line path, there is a problem in that the heat radiation effect is degraded.

In order to resolve the above-identified and other problems with conventional approaches, it is an object of the present disclosure to provide a compact radio-frequency module and a compact communication apparatus, which have improved heat radiation effect from the transmission power amplifier.

In view of the above, a radio-frequency module according to an embodiment of the present disclosure includes a mounting substrate which has a first main face and a second main face, which are opposed to each other, and in which radio-frequency components are capable of being mounted on the first main face and the second main face; a transmission power amplifier (PA) that is mounted on the first main face, that is the radio-frequency component, and that has an emitter terminal; a through electrode that is connected to the emitter terminal of the transmission power amplifier and that passes through the mounting substrate between the first main face and the second main face; and a ground terminal that is connected to the through electrode.

With the above configuration, since the circuit components are mounted on both of the mounting faces of the mounting substrate, it is possible to increase the density and reduce the size, compared with a radio-frequency module using the single-side mounted substrate. In addition, since the transmission power amplifier having a high heating value is mounted on the first main face and the emitter terminal is connected to the ground terminal with the through electrode formed in the mounting substrate, a heat radiation path only through a planar wiring pattern having high thermal resistance, among the lines in the mounting substrate, is capable of being excluded. Accordingly, it is possible to provide the compact radio-frequency module having improved heat radiation effect from the transmission power amplifier to the external substrate.

The radio-frequency module may be connected to an external substrate, and the ground terminal may be connected to the external substrate.

The radio-frequency module may further include first resin that is formed on the first main face and that covers at least part of the transmission power amplifier.

With the above configuration, since the transmission power amplifier having high heat production is covered with the first resin, the heat radiation effect from the transmission power amplifier to the external substrate is improved while improving mounting reliability of the transmission power amplifier.

The radio-frequency module may further include a circuit component mounted on the second main face and second resin that is formed on the second main face and that convers at least part of the circuit component. The ground terminal may be arranged on the second resin.

With the above configuration, the through electrode is formed also in the second resin while improving the mounting reliability of the circuit component. Accordingly, it is possible to exclude the heat radiation path only through the planar wiring pattern having high thermal resistance, among the lines formed in the mounting substrate and the second resin.

The radio-frequency module may further include a ground electrode layer formed of a planar wiring pattern in the mounting substrate and a first shield electrode layer that is formed so as to cover a top face and side faces of the first resin and that is connected to the ground electrode layer at side faces of the mounting substrate.

With the above configuration, it is possible to inhibit the transmission signal from the transmission power amplifier from being directly and externally radiated from the radio-frequency module and it is possible to inhibit external noise from intruding into a first electronic component. In addition, since the heat generated in the transmission power amplifier is capable of being radiated through the first shield electrode layer, the heat radiation effect is improved.

The radio-frequency module may further include a second shield electrode layer that is formed on side faces of the second resin and that is connected to the ground electrode layer at the side faces of the mounting substrate.

With the above configuration, since the second shield electrode layer is formed along with the first shield electrode layer, the entire radio-frequency module is shielded. Accordingly, it is possible to further inhibit the transmission signal from the transmission power amplifier from being directly and externally radiated from the radio-frequency module and it is possible to inhibit the external noise from intruding into the first electronic component and a second electronic component. In addition, since the heat generated in the transmission power amplifier is capable of being radiated through the second shield electrode layer, the heat radiation effect is further improved.

In a plan view of the radio-frequency module in a direction vertical to the first main face and the second main face, a footprint of the through electrode may at least partially overlap a footprint of the ground terminal.

With the above configuration, since the emitter terminal is capable of being connected to the ground terminal with a substantially minimum distance and the thermal resistance on the heat radiation path from the transmission power amplifier to the ground terminal is capable of being decreased, it is possible to further improve the heat radiation effect from the transmission power amplifier to the external substrate. In addition, since the area in which the through electrode is formed in the second resin is capable of being limited to an area almost immediately below the transmission power amplifier, it is possible to increase the area in which the circuit component mounted on the second main face is formed. Accordingly, the degree of freedom of the arrangement of the circuit component is improved. The circuit component may be a low noise reception amplifier.

With the above configuration, since the transmission power amplifier and the low noise reception amplifier are arranged with the mounting substrate sandwiched therebetween, it is possible to ensure the isolation between the transmission power amplifier and the low noise reception amplifier to suppress interference between the transmission signal and the reception signal. In particular, it is possible to suppress reduction in the reception sensitivity due to intrusion of the transmission signal having high power into a reception path.

In a plan view of the radio-frequency module in a direction vertical to the first main face and the second main face, the transmission power amplifier may not overlap a footprint of the low noise reception amplifier.

With the above configuration, since the distance between the transmission power amplifier and the low noise reception amplifier is capable of being further increased, and, in free space, RF energy obeys the inverse square law where RF energy falls off with the square of distance, it is possible to further ensure the isolation between the transmission power amplifier and the low noise reception amplifier to suppress the interference between the transmission signal and the reception signal. In addition, since the through electrode with which the transmission power amplifier connected to the ground terminal is not restricted by the arrangement of the low noise reception amplifier, it is possible to connect the transmission power amplifier to the ground terminal with a minimum distance.

The radio-frequency module may further include a transmission filter mounted on the first main face and a reception filter mounted on the first main face. In a plan view of the radio-frequency module in a direction vertical to the first main face and the second main face, a footprint of the low noise reception amplifier may at least partially overlap a footprint of the reception filter.

With the above configuration, since the line length of the reception path including the low noise reception amplifier and the reception filter is capable of being decreased, it is possible to reduce the transmission loss of the reception signal. In addition, since decreasing the line length enables parasitic capacitance on the reception path to be suppressed, it is possible to suppress reduction in noise figure.

The radio-frequency module may further include a transmission filter mounted on the first main face and a reception filter mounted on the first main face. In a plan view of the radio-frequency module in a direction vertical to the first main face, the transmission filter may be arranged between the transmission power amplifier and the reception filter.

With the above configuration, since the line length of the transmission path including the transmission power amplifier and the transmission filter is capable of being decreased, it is possible to reduce the transmission loss of the transmission signal. In addition, since the interposition of the transmission filter enables the distance between the transmission power amplifier, which outputs the transmission signal having high power, and the reception filter to be ensured, it is possible to suppress the reduction in the reception sensitivity caused by the interference of the transmission signal.

In a plan view of the radio-frequency module in a direction vertical to the first main face and the second main face, a footprint of the low noise reception amplifier mounted on the second main face may be at least partially overlap a footprint of the reception filter.

With the above configuration, since the line length of the transmission path including the transmission power amplifier and the transmission filter is capable of being decreased and the line length of the reception path including the low noise reception amplifier and the reception filter is capable of being decreased, it is possible to reduce the transmission loss of the reception signal and the transmission signal. In addition, it is possible to suppress both the reduction in the reception sensitivity and the reduction in noise figure.

A radio-frequency module according to an embodiment of the present disclosure includes a mounting substrate which has a first main face and a second main face, which are opposed to each other, and in which radio-frequency components are capable of being mounted on the first main face and the second main face; a transmission power amplifier arranged on the first main face; a through electrode that is connected to the transmission power amplifier and that passes through the mounting substrate between the first main face and the second main face; and an external connection terminal that is arranged on the second main face and that is connected to the through electrode.

With the above configuration, since the circuit components are mounted on both of the mounting faces of the mounting substrate, it is possible to increase the density and reduce the size, compared with a radio-frequency module using the single-side mounted substrate. In addition, since the transmission power amplifier having a high heating value is mounted on the first main face and the transmission power amplifier is connected to the external connection terminal with the through electrode formed in the mounting substrate, the heat radiation path only through the planar wiring pattern having high thermal resistance, among the lines in the mounting substrate, is capable of being excluded. Accordingly, it is possible to provide the compact radio-frequency module having improved heat radiation effect from the transmission power amplifier to the external substrate.

The radio-frequency module may be connected to an external substrate, and the external connection terminal may be connected to the external substrate.

In a plan view of the radio-frequency module in a direction vertical to the first main face and the second main face, a footprint of the through electrode may at least partially overlap a footprint of the external connection terminal.

With the above configuration, since the transmission power amplifier is capable of being connected to the external connection terminal with a substantially minimum distance and the thermal resistance on the heat radiation path from the transmission power amplifier is capable of being decreased, it is possible to further improve the heat radiation effect from the transmission power amplifier to the external substrate. In addition, since the area in which the external connection terminal is formed at the second main face side is capable of being limited to an area almost immediately below the transmission power amplifier, it is possible to increase the area in which the circuit component mounted on the second main face is formed. Accordingly, the degree of freedom of the arrangement of the circuit component is improved.

A communication apparatus according to an embodiment of the present disclosure includes the external substrate and any of the radio-frequency modules described above. The external substrate has an external ground electrode electrically connected to the ground terminal.

With the above configuration, the transmission power amplifier having a high heating value is mounted on the first main face, the low noise reception amplifier is mounted on the second main face, and the transmission power amplifier is connected to the ground terminal with the through electrode formed in the mounting substrate. Accordingly, it is possible to provide the compact communication apparatus having improved heat radiation effect from the transmission power amplifier to the external substrate.

In a plan view of the communication apparatus from a direction vertical to the first main face and the second main face, a footprint of the external ground electrode may at least partially overlap a footprint of the through electrode.

With the above configuration, the emitter terminal is capable of being connected to the external ground electrode with a substantially minimum distance and the thermal resistance on the heat radiation path from the transmission power amplifier to the external ground electrode is capable of being decreased. Accordingly, it is possible to provide the communication apparatus having further improved heat radiation effect from the transmission power amplifier to the external substrate.

According to the present disclosure, it is possible to provide a compact radio-frequency module and a compact communication apparatus, which have improved heat radiation effect from the transmission power amplifier.

Other features, elements, characteristics, and advantages of the present disclosure will become more apparent from the following detailed description of preferred embodiments of the present disclosure with reference to the attached drawings.

DETAILED DESCRIPTION

Figure 1A:
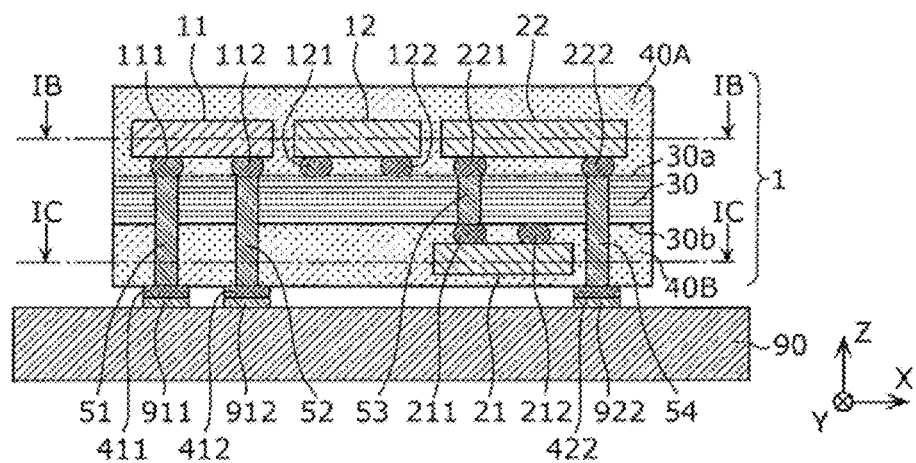
FIG. 1A is a first cross-sectional view (along cut IA as shown in FIGS. 1B and 1C) illustrating a configuration of a radio-frequency module according to an embodiment.

Embodiments of the present disclosure will herein be described in detail using the embodiments with reference to the drawings. All the embodiments described below indicate comprehensive or specific examples. Numerical values, shapes, materials, components, the arrangement of the components, the connection mode of the components, and so on, which are indicated in the embodiments described below, are only examples and are not intended to limit the present disclosure. In addition, the sizes or the ratios of the sizes of the components illustrated in the drawings are not necessarily strictly indicated.

In this description, in A, B, and C mounted on a substrate, "arrangement of C between A and B in a plan view of the substrate (or the main face of the substrate)" is defined as overlapping of at least part of the area of C, which is projected in a plan view of the substrate, with a line connecting an arbitrary point in the area of A, which is projected in a plan view of the substrate, to an arbitrary point in the area of B, which is projected in a plan view of the substrate.

EMBODIMENTS

1. Configuration of Radio-Frequency Module 1 According to Embodiment

Figure 1B:
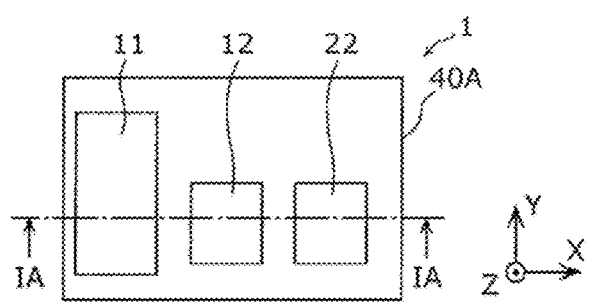
FIG. 1B is a second cross-sectional view (along cut IB in FIG. 1A) illustrating the configuration of the radio-frequency module according to the embodiment.
Figure 1C:
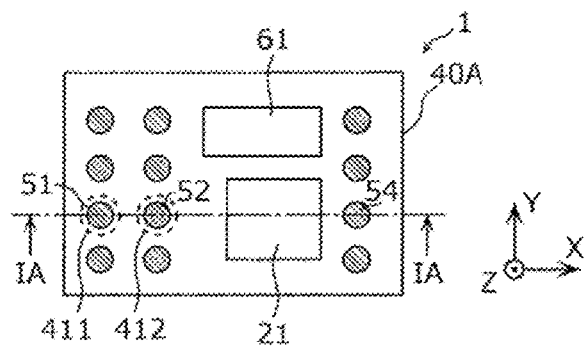
FIG. 1C is a third cross-sectional view (cut along IC in FIG. 1A) illustrating the configuration of the radio-frequency module according to the embodiment.

FIG. 1A is a first cross-sectional view illustrating the configuration of a radio-frequency module 1 according to an embodiment. FIG. 1B is a second cross-sectional view illustrating the configuration of the radio-frequency module 1 according to the embodiment. FIG. 1C is a third cross-sectional view illustrating the configuration of the radio-frequency module 1 according to the embodiment. More specifically, FIG. 1A is a cross-sectional view when a cross section along the IA-IA line in FIG. 1B and FIG. 1C is viewed from a Y-axis positive direction. FIG. 1B is a cross-sectional view when a cross section along the IB-IB line in FIG. 1A is viewed from a Z-axis negative direction. FIG. 1C is a cross-sectional view when a cross section along the IC-IC line in FIG. 1A is viewed from the Z-axis negative direction.

As illustrated in FIG. 1A, the radio-frequency module 1 includes a mounting substrate 30, a power amplifier (PA) 11, a low noise amplifier (LNA) 21, a transmission filter 12, a reception filter 22, resin members 40A and 40B, through electrodes 51, 52, 53, and 54, and ground terminals 411, 412, and 422.

The radio-frequency module 1 is capable of being electrically connected to an external substrate 90. The external substrate 90 has ground electrodes 911, 912, and 922 on the surface in a Z-axis positive direction and corresponds to, for example, a mother board of a mobile phone or a communication device.

The radio-frequency module 1 is capable of being electrically connected to the external substrate 90. The connection may be via direct mounting on the external substrate 90, or via indirect mounting on the external substrate 90. Under the condition that the radio-frequency module 1 is indirectly mounted on the external substrate 90, the radio-frequency module 1 is mounted on another radio-frequency module mounted on the external substrate 90. Thus, the two or more RF modules may be ganged together on the external substrate 90.

An example of the circuit configuration of a radio-frequency module 1A, which is an example of the specific configuration of the radio-frequency module 1, will now be described.

Figure 2A:
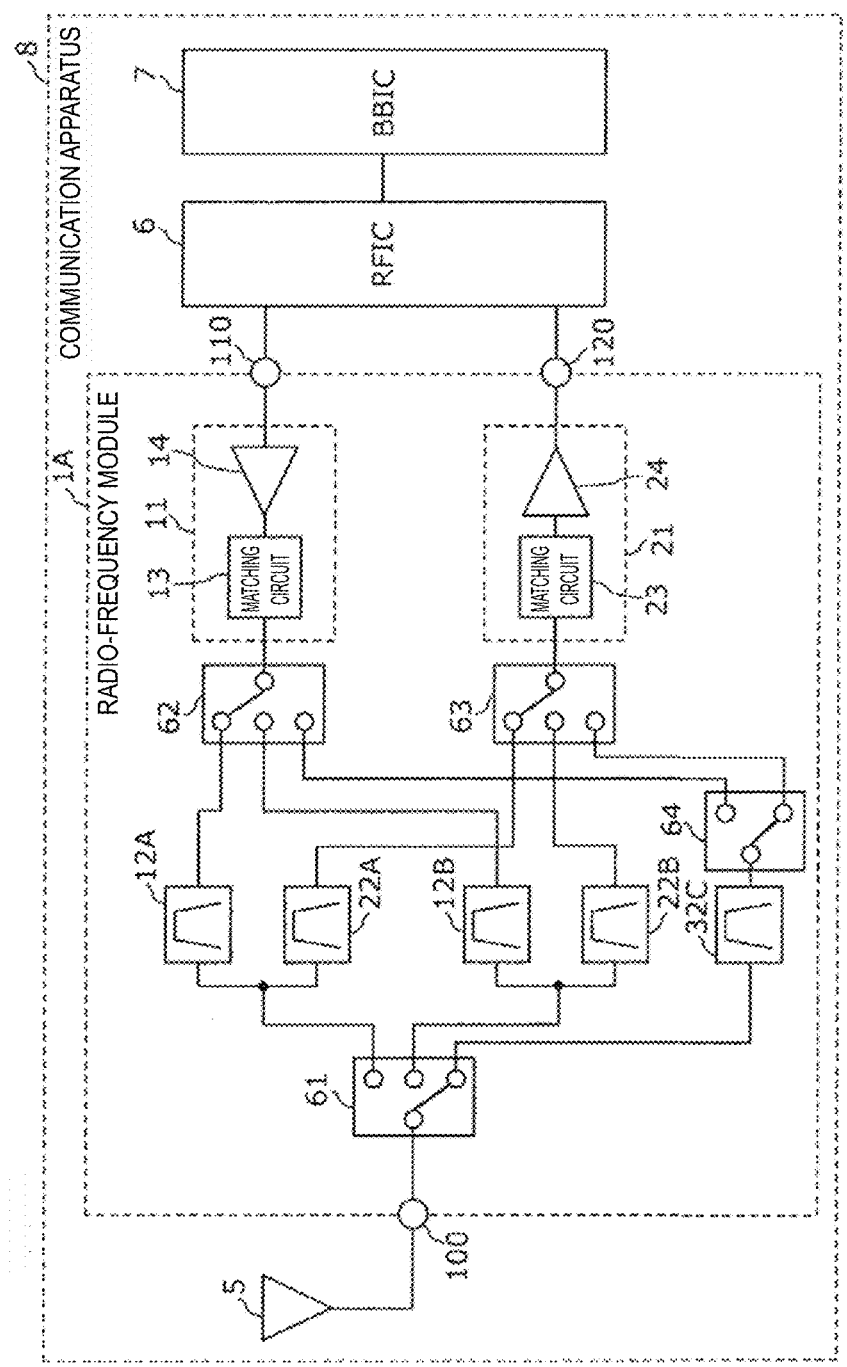
FIG. 2A is a block diagram illustrating the configuration of a radio-frequency module and a communication apparatus according to an example.

FIG. 2A is a block diagram illustrating the configuration of the radio-frequency module 1A and a communication apparatus 8 according to an example. The radio-frequency module 1A according to the present example, a common input-output terminal 100, a transmission input terminal 110, a reception output terminal 120, an antenna element 5, a radio-frequency (RF) signal processing circuit (radio-frequency integrated circuit (RFIC)) 6, and a baseband signal processing circuit (baseband integrated circuit (BBIC)) 7 are illustrated in FIG. 2A. The radio-frequency module 1A illustrated in FIG. 2A is an example of the specific circuit configuration of the radio-frequency module 1 illustrated in FIG. 1A to FIG. 1C. The radio-frequency module 1A, the antenna element 5, the RFIC 6, and the BBIC 7 compose the communication apparatus 8. The communication apparatus 8 includes the radio-frequency module 1 according to the present embodiment (or the radio-frequency module 1A according to the example) and the external substrate 90 illustrated in FIG. 1A.

The radio-frequency module 1A includes the PA 11, the LNA 21, transmission filters 12A and 12B, reception filters 22A and 22B, a transmission-reception filter 32C, and switches 61, 62, 63, and 64.

The transmission filter 12A is a filter element using, for example, the transmission band of a band (frequency band) A as a pass band. The transmission filter 12B is a filter element using, for example, the transmission band of a band (frequency band) B as the pass band. The reception filter 22A is a filter element using, for example, the reception band of the band (frequency band) A as the pass band. The reception filter 22B is a filter element using, for example, the reception band of the band (frequency band) B as the pass band. The transmission filter 12A and the reception filter 22A may compose a duplexer for the band A. The transmission filter 12B and the reception filter 22B may compose a duplexer for the band B. The transmission-reception filter 32C is a filter element using, for example, the transmission-reception band of a band (frequency band) C as the pass band.

The switch 61 is a single pole 3 throw (SP3T) switch circuit which has a common terminal and three selection terminals and in which the common terminal is connected to the common input-output terminal 100 and the three selection terminals are connected to a connection terminal between the transmission filter 12A and the reception filter 22A, a connection terminal between the transmission filter 12B and the reception filter 22B, and the transmission-reception filter 32C, respectively. The switch 61 has a function to switch between a band A signal path, a band B signal path, and a band C signal path. It is sufficient for the switch 61 to be a switch circuit for conduction between the common terminal and at least one of the three selection terminals.

The arrangement of the switch 61 enables the signal of the band A, the signal of the band B, and the signal of the band C to be transmitted with high isolation. In addition, when the switch 61 is a multi-connection switch circuit, it is possible to concurrently transmit the signals of at least two bands of the band A, the band B, and the band C.

The switch 62 is an SP3T switch circuit which has a common terminal and three selection terminals and in which the common terminal is connected to the PA 11 and the three selection terminals are connected to an input terminal of the transmission filter 12A, an input terminal of the transmission filter 12B, and one selection terminal of the switch 64, respectively. The switch 62 has a function to switch between a band A transmission signal path, a band B transmission signal path, and a band C transmission signal path. It is sufficient for the switch 62 to be a switch circuit for conduction between the common terminal and at least one of the three selection terminals.

The arrangement of the switch 62 enables the transmission signals of the band A, the band B, and the band C to be amplified with one PA 11. Accordingly, it is possible to reduce the radio-frequency module 1A in size.

The switch 63 is an SP3T switch circuit which has a common terminal and three selection terminals and in which the common terminal is connected to the LNA 21 and the three selection terminals are connected to an output terminal of the reception filter 22A, an output terminal of the reception filter 22B, and the other selection terminal of the switch 64, respectively. The switch 63 has a function to switch between a band A reception signal path, a band B reception signal path, and a band C reception signal path. It is sufficient for the switch 63 to be a switch circuit for conduction between the common terminal and at least one of the three selection terminals.

The arrangement of the switch 63 enables the reception signals of the band A, the band B, and the band C to be amplified with one LNA 21. Accordingly, it is possible to reduce the radio-frequency module 1A in size.

The switch 64 is a single pole double throw (SPDT) switch circuit which has a common terminal and two selection terminals and in which the common terminal is connected to the transmission-reception filter 32C. The switch 64 has a function to switch a signal path including the transmission-reception filter 32C to the transmission signal path or the reception signal path.

The arrangement of the switch 64 enables the transmission signal and the reception signal of the band C to be addressed with one transmission-reception filter 32C. Accordingly, it is possible to reduce the radio-frequency module 1A in size.

The LNA 21 is a low noise reception amplifier including a matching circuit 23 and an amplifier transistor device 24. The LNA 21 amplifies a radio-frequency reception signal input from the switch 63 and supplies the radio-frequency reception signal to the reception output terminal 120. The LNA 21 may not include the matching circuit 23.

The amplifier transistor device 24 is an amplifier device including, for example, a bipolar transistor.

The matching circuit 23 is a circuit for matching the output impedances from the reception filters 22A and 22B and the transmission-reception filter 32C with the input impedance into the amplifier transistor device 24. The matching circuit 23 is composed of, for example, passive elements, such as an inductor and a capacitor.

The arrangement of the matching circuit 23 enables the transmission loss and the noise figure of the reception signal to be reduced.

The PA 11 is a transmission power amplifier including a matching circuit 13 and an amplifier transistor device 14. The PA 11 amplifies a radio-frequency transmission signal input from the transmission input terminal 110. The PA 11 may not include the matching circuit 13.

The matching circuit 13 is a circuit for matching the output impedance from the amplifier transistor device 14 with the input impedances into the transmission filters 12A and 12B and the transmission-reception filter 32C. The matching circuit 13 is composed of, for example, the passive elements, such as an inductor and a capacitor.

The arrangement of the matching circuit 13 enables the transmission loss of the transmission signal to be reduced.

The configuration of the PA 11 will now be described in detail, illustrating the circuit configuration of the PA 11 as an example.

Figure 2B:
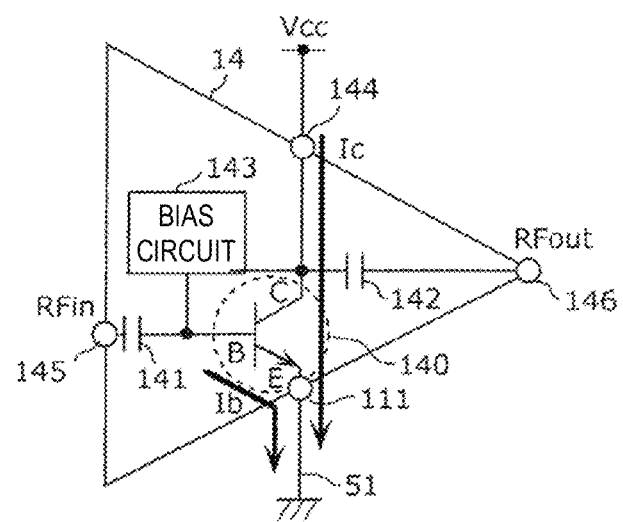
FIG. 2B is a circuit configuration diagram of an amplifier device in the radio-frequency module according to the example.

FIG. 2B is a circuit configuration diagram of the amplifier transistor device 14 in the radio-frequency module 1A according to the example. As illustrated in FIG. 2B, the amplifier transistor device 14 includes a transistor 140, capacitors 141 and 142, a bias circuit 143, a collector terminal 144, an emitter terminal 111, an input terminal 145, and an output terminal 146.

The transistor 140 is, for example, a bipolar transistor of an emitter-grounded type, which has a collector, an emitter, and a base. The transistor 140 amplifies radio-frequency current input into the base and outputs the radio-frequency current from the collector. The transistor 140 may be a field effect transistor having a drain, a source, and a gate. In this case, the transistor 140 is, for example, the field effect transistor of a source grounded type, which amplifies the radio-frequency current input into the gate and outputs the radio-frequency current from the drain.

The capacitor 141 is a direct-current (DC) cut capacitor element and has a function to prevent leakage of direct current into the input terminal 145 with direct-current bias voltage applied from the bias circuit 143 to the base.

The capacitor 142 is a DC cut capacitor element and has a function to remove a direct-current component of a radio-frequency amplification signal on which the direct-current bias voltage is superimposed. The radio-frequency amplification signal from which the direct-current component is removed is output from the output terminal 146.

The bias circuit 143 is connected to the base of the transistor 140 and has a function to optimize the operating point of the transistor 140 by applying bias voltage to the base.

In the above circuit configuration of the amplifier transistor device 14, a radio-frequency signal RFin input from the input terminal 145 flows from the base of the transistor 140 to the emitter thereof as base current Ib. The base current Ib is amplified by the transistor 140 and flows as collector current Ic. A radio-frequency signal RFout corresponding to the collector current Ic is output from the output terminal 146. At this time, high current resulting from combination of the base current Ib with the collector current Ic flows from the emitter terminal 111 to ground.

The emitter terminal 111 may be arranged outside the amplifier transistor device 14 and inside the PA 11. In other words, the emitter terminal 111 may not be included in the amplifier transistor device 14 and may be included in the PA 11.

Referring back to FIG. 2A, the configuration of the communication apparatus 8 will be described.

The RFIC 6 performs signal processing, such as down-conversion, on the radio-frequency reception signal input from the antenna element 5 through the radio-frequency module 1A and supplies a reception signal resulting from the signal processing to the BBIC 7.

The BBIC 7 is a circuit that performs signal processing using an intermediate frequency band lower than the frequency of the radio-frequency signal in a front end unit. The signal processed in the BBIC 7 is used as, for example, an image signal for image display or an audio signal for talking with a speaker.

With the above configuration, the radio-frequency module 1A is capable of selecting any of the band A radio-frequency signal, the band B radio-frequency signal, and the band C radio-frequency signal through a switching operation of the switches 61 to 64 and transmitting the selected radio-frequency signal. Although the radio-frequency module 1A is applied to a (non-carrier aggregation (CA)) mode in which each of the transmission-reception signals of the above three frequency bands is independently transmitted, the radio-frequency module 1A may be applied to a (CA) mode in which two or more transmission-reception signals, among the transmission-reception signals of the above three frequency bands, are concurrently transmitted.

Although the radio-frequency module 1A, which is a transmission-reception demultiplexing-multiplexing circuit, is exemplified as the radio-frequency module in the present embodiment, the radio-frequency module according to the embodiments of the present disclosure may be a transmission multiplexing circuit and the number of frequency bands (signal paths) is not limited.

In addition to the components in the circuit illustrated in FIG. 2A, electronic components, such as a capacitor, an inductor, and a resistance element, may be arranged at nodes with which the respective circuit elements are connected.

Referring back to FIG. 1A, the configuration of the radio-frequency module 1 will be described.

The mounting substrate 30 is a dual-side mounted substrate which has a main face 30a and a main face 30b, which are opposed to each other, and in which circuit components are mounted on each of the main faces 30a and 30b. The main face 30a is a first main face of the mounting substrate 30 at the Z-axis positive direction side and the main face 30b is a second main face of the mounting substrate 30 at the Z-axis negative direction side. The mounting substrate 30 is a multilayer substrate in which multiple layers are laminated. The mounting substrate 30 is, for example, a ceramic multilayer substrate or a printed circuit board (PCB) substrate. The mounting substrate 30 has a planar wiring pattern set to ground potential.

The PA 11 is a transmission power amplifier that has the emitter terminal 111 and an emitter terminal 112, that is mounted on the main face 30a, and that amplifies the radio-frequency transmission signal. The PA 11 has a base terminal (not illustrated in FIG. 1A), the collector terminal 144 (not illustrated in FIG. 1A), the emitter terminals 111 and 112, and the amplifier transistor device 14 (not illustrated in FIG. 1A). The amplifier transistor device 14 may have a configuration in which multiple transistors 140 are cascade-connected. In this case, the amplifier transistor device 14 may have multiple base terminals, multiple collector terminals, and multiple emitter terminals. From this point of view, the multiple emitter terminals 111 and 112 are illustrated in FIG. 1A.

The base terminal (not illustrated in FIG. 1A and corresponding to the input terminal 145 in FIG. 2B), the collector terminal 144 (not illustrated in FIG. 1A and illustrated in FIG. 2B), and the emitter terminals 111 and 112 (illustrated in FIG. 1A) are arranged on the main face 30a and are formed of metal electrode layers, metal bump members, or the likes.

In the amplifier transistor device 14, the base of the transistor 140 is connected to the above base terminal, the collector of the transistor 140 is connected to the collector terminal 144, the emitter of the transistor 140 is connected to the emitter terminal 111 or 112, and the collector current Ic flows from the collector terminal 144 to the emitter terminal 111 or 112, as described above with reference to FIG. 2B. When the amplifier transistor device 14 is the field effect transistor, the gate of the transistor 140 is connected to the input terminal 145, the drain of the transistor 140 is connected to a drain terminal (corresponding to the collector terminal 144), the source of the transistor 140 is connected to a source terminal (corresponding to the emitter terminal 111 or 112), and drain current flows from the drain terminal to the source terminal.

The LNA 21 is a circuit component that has connection terminals 211 and 212 connected to the mounting substrate 30 and that is mounted on the main face 30b. The LNA 21 is, for example, a low noise reception amplifier that amplifies the radio-frequency reception signal. Although the LNA 21 is exemplified as the circuit component in the present embodiment, the circuit component may be an active element or a passive element other than the low noise reception amplifier.

The transmission filter 12 is a filter element that has connection terminals 121 and 122 connected to the mounting substrate 30 and that uses the transmission band of a certain frequency band as the pass band.

The reception filter 22 is a filter element that has connection terminals 221 and 222 connected to the mounting substrate 30 and that uses the reception band of a certain frequency band as the pass band. The connection terminal 211 of the LNA 21 is connected to the connection terminal 221 of the reception filter 22 with the through electrode 53.

With the above configuration, since the line connecting the reception filter 22 to the LNA 21 is capable of being shortened, it is possible to reduce the transmission loss of the reception signal.

The ground terminals 411, 412, and 422 are arranged at the main face 30b side with respect to the mounting substrate 30, and thus serve as ground nodes. The ground terminal 411 is electrically connected to the emitter terminal 111 of the PA 11 with the through electrode 51 and is directly connected to the ground electrode 911 of the external substrate 90. The ground terminal 412 is electrically connected to the emitter terminal 112 of the PA 11 with the through electrode 52 and is directly connected to the ground electrode 912 of the external substrate 90. The ground terminal 422 is electrically connected to the connection terminal 222 of the reception filter 22 with the through electrode 54 and is directly connected to the ground electrode 922 of the external substrate 90. The ground terminals 411, 412, and 422 are joined to the ground electrodes 911, 912, and 922, respectively, with, for example, solder members interposed therebetween. The ground terminals 411, 412, and 422 may be bump members (including solder balls) joined to the leading ends in the Z-axis negative direction of the through electrodes 51, 52, and 54, respectively. In addition, the ground terminals 411, 412, and 422 may be plating layers or the likes formed on the leading ends in the Z-axis negative direction of the through electrodes 51, 52, and 54, respectively. Furthermore, when the electrode layers and electrode terminals are not formed on the leading ends in the Z-axis negative direction of the through electrodes 51, 52, and 54 as the radio-frequency module 1, the ground terminals 411, 412, and 422 are defined as the leading ends themselves in the Z-axis negative direction of the through electrodes 51, 52, and 54, respectively. In other words, the leading ends in the Z-axis negative direction of the through electrodes 51, 52, and 54 are joined to the ground electrodes 911, 912, and 922, respectively, with the solder members or the likes.

The through electrode 51 is an electrode with which the emitter terminal 111 is electrically connected to the ground terminal 411 and which passes through the mounting substrate 30 from the main face 30a to the main face 30b. The through electrode 52 is an electrode with which the emitter terminal 112 is electrically connected to the ground terminal 412 and which passes through the mounting substrate 30 from the main face 30a to the main face 30b.

The through electrode 53 is an electrode with which the connection terminal 221 of the reception filter 22 is electrically connected to the connection terminal 211 of the LNA 21 and which passes through the mounting substrate 30 from the main face 30a to the main face 30b. The through electrode 54 is an electrode with which the connection terminal 222 of the reception filter 22 is electrically connected to the ground terminal 422 and which passes through the mounting substrate 30 from the main face 30a to the main face 30b.

In the present embodiment, the through electrodes 51, 52, and 54 pass through not only the mounting substrate 30 but also the resin member 40B.

The resin member 40A is first resin that is formed on the main face 30a and that covers the side faces and the top faces of the PA 11, the transmission filter 12, and the reception filter 22. It is sufficient for the resin member 40A to cover at least the side faces of the PA 11.

The resin member 40B is second resin that is formed on the main face 30b and that covers the side faces and the top face of the LNA 21. It is sufficient for the resin member 40B to cover at least the side faces of the circuit component.

The through electrodes 53 and 54 and the resin members 40A and 40B are not essential components for the radio-frequency module 1 according to the present embodiment.

As discussed above, a radio-frequency module using a single-side mounted substrate is exemplified as a radio-frequency module in the related art. According to this conventional approach, because the circuit components are arranged on a same plane, a conventional approach to reducing size and enhancing integration has been addressed by decreasing the spacings between the circuit components and reducing the sizes of the circuit components themselves. However, under the use case of long term evolution (LTE) communication and 5th generation (5G) mobile communication systems, the area in which the radio-frequency components are capable of being installed on a mobile terminal is further decreased in size so there is a practical limit on the reduction in the size of a planar product. In addition, since the PA and the LNA are arranged on the same plane in the single-side mounting method, the LNA is susceptible to RFI due to the co-planar geometry with the PA, and it is difficult to reliably ensure isolation between transmission and reception circuitry. Moreover, the LNA is particularly susceptible to RFI from the co-located PA because the LNA amplifies relatively weak signals, and thus any extraneous emissions from the PA may find an unintended propagation path into the LNA signal path, thereby having the undesirable effect of raising the effective noise/interference floor of the LNA.

In contrast, with the above configuration of the radio-frequency module 1 according to the present embodiment, since the radio-frequency circuit components are mounted on both of the main faces 30a and 30b of the mounting substrate 30, it is possible to increase the density and reduce the size, compared with the radio-frequency module using the single-side mounted substrate.

In addition, the PA 11 having a high heating value is mounted on the main face 30a, the through electrode 51 formed in the mounting substrate 30 is connected to the emitter terminal 111 and the ground terminal 411, and the through electrode 52 formed in the mounting substrate 30 is connected to the emitter terminal 112 and the ground terminal 412. With this configuration, among the lines in the mounting substrate 30, a heat radiation path only through the planar wiring pattern along an XY plane direction having high thermal resistance is capable of being excluded. Accordingly, it is possible to provide the compact radio-frequency module 1 having improved heat radiation effect from the PA 11 to the external substrate 90.

Specifically, in the radio-frequency module 1 according to the present embodiment, the PA 11 is arranged at a side opposite to the side where the ground terminals 411 and 412 are formed with respect to the mounting substrate 30. In addition, the ground terminals 411 and 412 are arranged at the main face 30b side, among the main face 30a and the main face 30b, with respect to the mounting substrate 30. The heat radiation path of the PA 11 is the emitter terminal 111—the through electrode 51—the ground terminal 411 and the emitter terminal 112—the through electrode 52—the ground terminal 412. If the PA 11 is arranged at the side where the ground terminals 411 and 412 are formed with respect to the mounting substrate 30, the emitter terminals 111 and 112 of the PA 11 are connected to the main face 30b and are connected to the ground terminals 411 and 412, respectively, with the through electrodes in the resin member 40B via the planar wiring pattern extending in the XY plane direction of the mounting substrate 30. In contrast, when the PA 11 is arranged on the main face 30a, as in the present embodiment, the heat radiation path is composed of a path through the through electrodes 51 and 52 and does not include the path only through the planar wiring pattern in the mounting substrate 30. In other words, since the emitter terminals 111 and 112 of the PA 11 are connected to the ground terminals 411 and 412 with the through electrodes 51 and 52, respectively, the heat radiation path having low thermal resistance is capable of being realized to improve the heat radiation effect of the radio-frequency module 1.

Since the arrangement of the resin member 40A causes the PA 11 having high heat production to be covered with the resin member 40A, the heat radiation effect from the PA 11 to the external substrate 90 is improved while improving mounting reliability of the PA 11.

In addition, in the present embodiment, the ground terminals 411, 412, and 422 are arranged on the resin member 40B, among the resin members 40A and 40B. In particular, the ground terminals 411, 412, and 422 are arranged on the surface (in the Z-axis negative direction) of the resin member 40B (the main face that is not in contact with the main face 30b, among the two main faces opposed to each other) in the present embodiment.

With the above configuration, the arrangement of the resin members 40A and 40B causes the through electrodes 51, 52, and 54 to be formed also in the resin member 40B while improving the mounting reliability of the PA 11 and the LNA 21. Accordingly, it is possible to exclude the heat radiation path only through the planar wiring pattern having high thermal resistance, among the lines formed in the mounting substrate 30 and the resin member 40B, across the mounting substrate 30 and the resin member 40B.

As illustrated in FIG. 1C, in a plan view of the radio-frequency module 1 from a direction vertical to the main faces 30a and 30b (from the Z-axis direction), a footprint of the through electrode 51 may overlap with a footprint of the ground terminal 411 and a footprint of the through electrode 52 may overlap with a footprint the ground terminal 412.

With the above configuration, the emitter terminal 111 is capable of being connected to the ground terminal 411 with a substantially minimum distance and the emitter terminal 112 is capable of being connected to the ground terminal 412 with a substantially minimum distance. Accordingly, since the thermal resistance on the heat radiation path from the PA 11 to the ground terminals 411 and 412 is capable of being decreased, it is possible to further improve the heat radiation effect from the PA 11 to the external substrate 90. In addition, since the area in which the through electrodes 51 and 52 are formed in the resin member 40B is capable of being limited to an area almost immediately below the PA 11, it is possible to increase the area in which the circuit components mounted on the main face 30b are formed.

Accordingly, the degree of freedom of the arrangement of the circuit components is improved.

A footprint of the through electrode 51 may not completely overlap with a footprint of the ground terminal 411, as in FIG. 1C, and it is sufficient for at least part of the footprint of the through electrode 51 to overlap with a footprint of the ground terminal 411. In addition, it is sufficient for at least part of the footprint of the through electrode 52 to overlap with a footprint of the ground terminal 412.

In the above plan view, the footprint of the through electrode 51 desirably overlaps with the footprint of the ground electrode 911 and the footprint of the through electrode 52 desirably overlaps with the a footprint of ground electrode 912.

With the above configuration, the emitter terminal 111 is capable of being connected to the ground electrode 911 with a substantially minimum distance and the emitter terminal 112 is capable of being connected to the ground electrode 912 with a substantially minimum distance. Accordingly, since the thermal resistance on the heat radiation path from the PA 11 to the external substrate 90 is capable of being decreased, it is possible to provide the communication apparatus 8 having the improved heat radiation effect from the PA 11 to the external substrate 90. The footprint of the through electrode 51 may not completely overlap with the footprint of the ground electrode 911 and it is sufficient for at least part of the footprint of the through electrode 51 to overlap with the footprint of the ground electrode 911. In addition, it is sufficient for at least part of the footprint of the through electrode 52 to overlap with the footprint of the ground electrode 912.

Since the PA 11 and the LNA 21 are arranged with the mounting substrate 30 sandwiched therebetween in the present embodiment, it is possible to ensure the isolation between the PA 11 and the LNA 21 to suppress interference between the transmission signal and the reception signal. In particular, it is possible to suppress reduction in the reception sensitivity due to intrusion of the transmission signal having high power into a reception path.

When the matching circuit 13 in the PA 11 includes a first chip inductor and the matching circuit 23 in the LNA 21 includes a second chip inductor in the present example, the first inductor is desirably mounted on the main face 30a and the second inductor is desirably mounted on the main face 30b. With this configuration, since the first inductor arranged on a transmission system circuit and the second inductor arranged on a reception system circuit are arranged with the mounting substrate 30 interposed therebetween, the magnetic-field coupling between the first inductor and the second inductor is capable of being suppressed. Accordingly, it is possible to ensure the isolation between the transmission system circuit and the reception system circuit to suppress the interference between the transmission signal and the reception signal. In particular, it is possible to suppress the reduction in the reception sensitivity due to intrusion of the transmission signal having high power into the reception path.

In the radio-frequency module 1A illustrated in FIG. 2A, a third chip inductor for impedance matching may be arranged between the switch 61 and the transmission filter 12A and the reception filter 22A, and a fourth chip inductor for impedance matching may be arranged between the switch 61 and the transmission filter 12B and the reception filter 22B. In addition, a fifth chip inductor for impedance matching may be arranged between the common input-output terminal 100 and the switch 61.

In the above configuration, the first inductor is desirably mounted on the main face 30a and the third inductor is desirably mounted on the main face 30b. With this configuration, since the first inductor and the third inductor are arranged with the mounting substrate 30 sandwiched therebetween, it is possible to suppress the magnetic-field coupling between the first inductor and the third inductor. Accordingly, since the intrusion of the transmission signal into the reception system circuit not through the transmission filter 12A is capable of being suppressed, it is possible to ensure the isolation between the transmission system circuit and the reception system circuit to suppress the interference between the transmission signal and the reception signal. In particular, it is possible to suppress the reduction in the reception sensitivity due to intrusion of the transmission signal having high power into the reception path.

In addition, in the above configuration, the first inductor is desirably mounted on the main face 30a and the fourth inductor is desirably mounted on the main face 30b. With this configuration, since the first inductor and the fourth inductor are arranged with the mounting substrate 30 sandwiched therebetween, it is possible to suppress the magnetic-field coupling between the first inductor and the fourth inductor. Accordingly, since the intrusion of the transmission signal into the reception system circuit not through the transmission filter 12B is capable of being suppressed, it is possible to ensure the isolation between the transmission system circuit and the reception system circuit to suppress the interference between the transmission signal and the reception signal. In particular, it is possible to suppress the reduction in the reception sensitivity due to intrusion of the transmission signal having high power into the reception path.

Furthermore, in the above configuration, the first inductor is desirably mounted on the main face 30a and the fifth inductor is desirably mounted on the main face 30b. With this configuration, since the first inductor and the fifth inductor are arranged with the mounting substrate 30 sandwiched therebetween, it is possible to suppress the magnetic-field coupling between the first inductor and the fifth inductor. Accordingly, since the intrusion of the transmission signal into the reception system circuit not through the transmission filters 12A and 12B is capable of being suppressed, it is possible to ensure the isolation between the transmission system circuit and the reception system circuit to suppress the interference between the transmission signal and the reception signal. In particular, it is possible to suppress the reduction in the reception sensitivity due to intrusion of the transmission signal having high power into the reception path.

Furthermore, in the above configuration, the third inductor is desirably mounted on the main face 30a and the second inductor is desirably mounted on the main face 30b. With this configuration, since the third inductor and the second inductor are arranged with the mounting substrate 30 sandwiched therebetween, it is possible to suppress the magnetic-field coupling between the third inductor and the second inductor. Accordingly, since the intrusion of the transmission signal into the reception system circuit not through the reception filter 22A is capable of being suppressed, it is possible to ensure the isolation between the transmission system circuit and the reception system circuit to suppress the interference between the transmission signal and the reception signal. In particular, it is possible to suppress the reduction in the reception sensitivity due to intrusion of the transmission signal having high power into the reception path.

Furthermore, in the above configuration, the fourth inductor is desirably mounted on the main face 30a and the second inductor is desirably mounted on the main face 30b. With this configuration, since the fourth inductor and the second inductor are arranged with the mounting substrate 30 sandwiched therebetween, it is possible to suppress the magnetic-field coupling between the fourth inductor and the second inductor. Accordingly, since the intrusion of the transmission signal into the reception system circuit not through the reception filter 22B is capable of being suppressed, it is possible to ensure the isolation between the transmission system circuit and the reception system circuit to suppress the interference between the transmission signal and the reception signal. In particular, it is possible to suppress the reduction in the reception sensitivity due to intrusion of the transmission signal having high power into the reception path.

Furthermore, in the above configuration, the fifth inductor is desirably mounted on the main face 30a and the second inductor is desirably mounted on the main face 30b. With this configuration, since the fifth inductor and the second inductor are arranged with the mounting substrate 30 sandwiched therebetween, it is possible to suppress the magnetic-field coupling between the fifth inductor and the second inductor. Accordingly, since the intrusion of the transmission signal into the reception system circuit not through the reception filters 22A and 22B is capable of being suppressed, it is possible to ensure the isolation between the transmission system circuit and the reception system circuit to suppress the interference between the transmission signal and the reception signal. In particular, it is possible to suppress the reduction in the reception sensitivity due to intrusion of the transmission signal having high power into the reception path.

2. Configuration of Radio-Frequency Module 1A According to Example

Figure 3A:
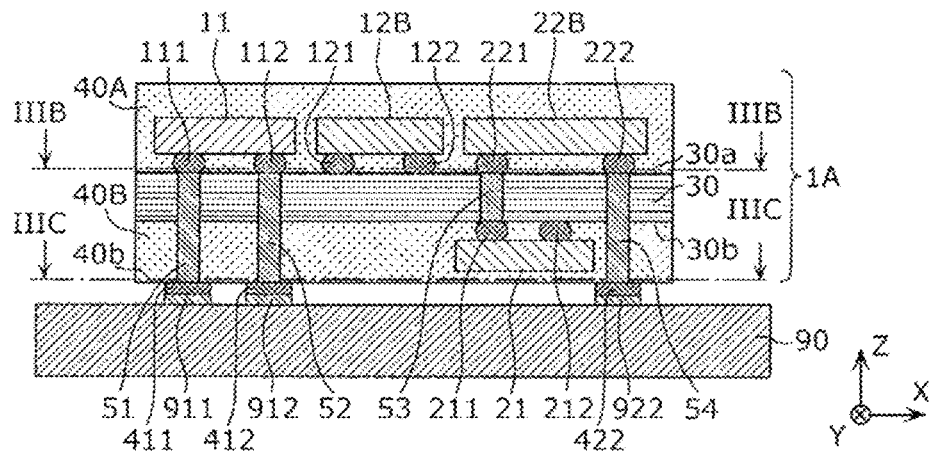
FIG. 3A is a first cross-sectional view (along cut IIIA in FIGS. 3B and 3C) illustrating a configuration of the radio-frequency module according to the example.
Figure 3B:
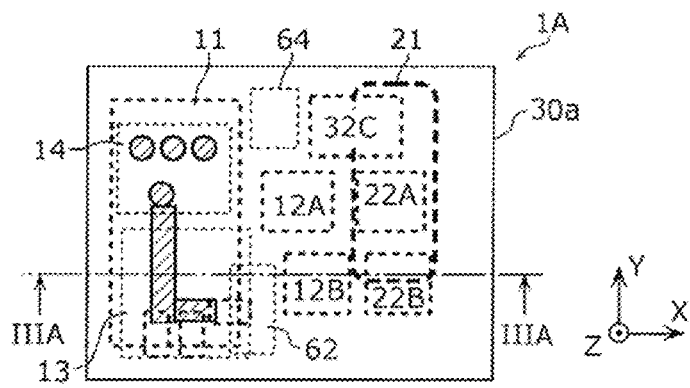
FIG. 3B is a second cross-sectional view (cut along IIIB in FIG. 3B) illustrating the configuration of the radio-frequency module according to the example.
Figure 3C:
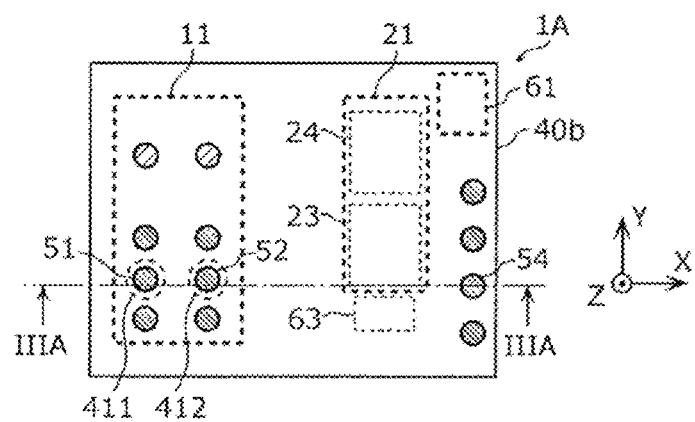
FIG. 3C is a third cross-sectional view (along cur IIIC in FIG. 3A) illustrating the configuration of the radio-frequency module according to the example.

FIG. 3A is a first cross-sectional view illustrating the configuration of the radio-frequency module 1A according to a first example. FIG. 3B is a second cross-sectional view illustrating the configuration of the radio-frequency module 1A according to the first example. FIG. 3C is a third cross-sectional view illustrating the configuration of the radio-frequency module 1A according to the first example. More specifically, FIG. 3A is a cross-sectional view when a cross section along the IIIA-IIIA line in FIG. 3B and FIG. 3C is viewed from the Y-axis positive direction. FIG. 3B is a cross-sectional view when a cross section along the IIIB-IIIB line in FIG. 3A is viewed from the Z-axis negative direction. FIG. 3C is a cross-sectional view when a cross section along the IIIC-IIIC line (a main face 40b) in FIG. 3A is viewed from the Z-axis negative direction. Not only the circuit elements and the terminals (solid lines) arranged on the respective cross sections but also the circuit elements (broken lines) that exist in a perspective view from the Z-axis direction are illustrated in FIG. 3B and FIG. 3C.

As illustrated in FIG. 3A to FIG. 3C, the radio-frequency module 1A includes the PA 11, the LNA 21, the transmission filters 12A and 12B, the reception filters 22A and 22B, the transmission-reception filter 32C, and the switches 61 to 64. The radio-frequency module 1A according to the present example is an example of the specific configuration of the radio-frequency module 1 according to the first embodiment. The radio-frequency module 1A according to the present example differs from the radio-frequency module 1 according to the embodiment in that the configurations of the filters and the switches are added in detail. The radio-frequency module 1A according to the present example will be described, focusing on the points different from the radio-frequency module 1 according to the embodiment.

The PA 11, the LNA 21, the transmission filters 12A and 12B, the reception filters 22A and 22B, the transmission-reception filter 32C, and the switches 61 to 64 are connected in the same manner as in the circuit configuration illustrated in FIG. 2A.

With the configuration of the radio-frequency module 1A according to the first example, since the circuit components are mounted on both of the main faces 30a and 30b of the mounting substrate 30, as illustrated in FIG. 3A, it is possible to increase the density and reduce the size, compared with the radio-frequency module using the single-side mounted substrate. In addition, the PA 11 having a high heating value is mounted on the main face 30a, the through electrode 51 formed in the mounting substrate 30 is connected to the emitter terminal 111 and the ground terminal 411, and the through electrode 52 is connected to the emitter terminal 112 and the ground terminal 412. With this configuration, among the lines in the mounting substrate 30, the heat radiation path only through the planar wiring pattern along the XY plane direction having high thermal resistance is capable of being excluded. Accordingly, it is possible to provide the compact radio-frequency module 1A having the improved heat radiation effect from the PA 11 to the external substrate 90.

As illustrated in FIG. 3C, in a plan view of the radio-frequency module 1A from the direction vertical to the main faces 30a and 30b (from the Z-axis direction), a footprint of the through electrode 51 overlaps with a footprint of the ground terminal 411 and a footprint of the through electrode 52 overlaps with a footprint of the ground terminal 412. Accordingly, since the thermal resistance on the heat radiation path from the PA 11 to the ground terminals 411 and 412 is capable of being decreased, it is possible to further improve the heat radiation effect from the PA 11 to the external substrate 90. In addition, since the area in which the through electrodes 51 and 52 are formed in the resin member 40B is capable of being limited to an area almost immediately below the PA 11, it is possible to increase the area in which the circuit components mounted on the main face 30b are formed. Accordingly, the degree of freedom of the arrangement of the circuit components is improved.

As illustrated in FIG. 3A to FIG. 3C, in a plan view of the radio-frequency module 1A from the direction vertical to the main faces 30a and 30b, a foot a footprint of the PA 11 desirably does not overlap with a footprint of the LNA 21.

With the above configuration, since the distance between the PA 11 and the LNA 21 is capable of being further increased and the electromagnetic field coupling between the PA 11 and the LNA 21 is capable of being suppressed, in addition to the arrangement of the PA 11 and the LNA 21 on the main faces 30a and 30b, respectively, it is possible to further ensure the isolation between the PA 11 and the LNA 21. In addition, since the through electrodes 51 and 52 with which the PA 11 is connected to the ground terminals 411 and 412, respectively, are not restricted by the arrangement of the LNA 21, it is possible to connect the PA 11 to the ground terminals 411 and 412 with a minimum distance.

In the above plan view, it is desirable that a footprint of the LNA 21 at least partially overlaps with a footprint of the reception filters 22A and 22B, as illustrated in FIG. 3A and FIG. 3B.

With the above configuration, since the line length of the reception path including the LNA 21 and the reception filter 22A or 22B is capable of being decreased, it is possible to reduce the transmission loss of the reception signal. In addition, since decreasing the line length enables parasitic capacitance on the reception path to be suppressed, it is possible to suppress reduction in the noise figure of the LNA 21.

In the above plan view, the transmission filters 12A and 12B are desirably arranged between the PA 11 and the reception filters 22A and 22B, as illustrated in FIG. 3A and FIG. 3B.

With the above configuration, since the line length of the transmission path including the PA 11 and the transmission filters 12A and 12B is capable of being decreased, it is possible to reduce the transmission loss of the transmission signal. In addition, since the interposition of the transmission filters 12A and 12B enables the distance between the PA 11, which outputs the transmission signal having high power, and the reception filters 22A and 22B to be ensured, it is possible to suppress the reduction in the reception sensitivity caused by the interference of the transmission signal.

3. Configuration of Radio-Frequency Module 2 According to First Modification

Figure 4A:
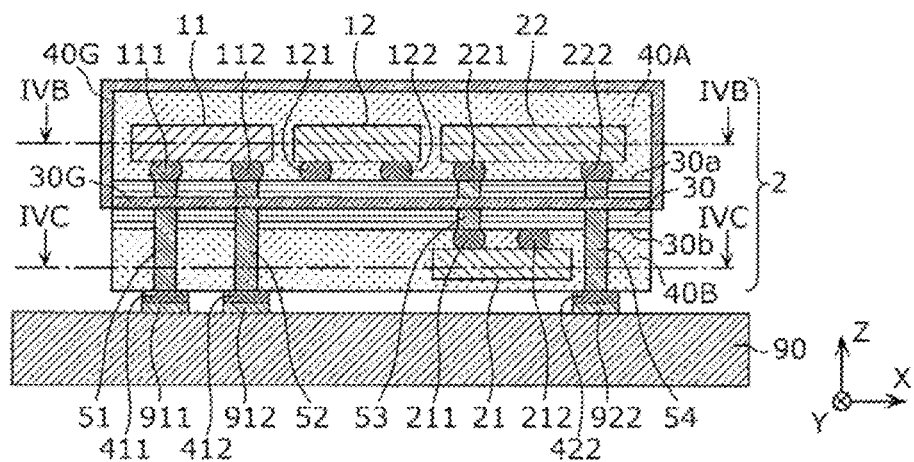
FIG. 4A is a first cross-sectional view (along cut IVA as shown in FIGS. 4B and 4C) illustrating a configuration of a radio-frequency module according to a first modification.
Figure 4B:
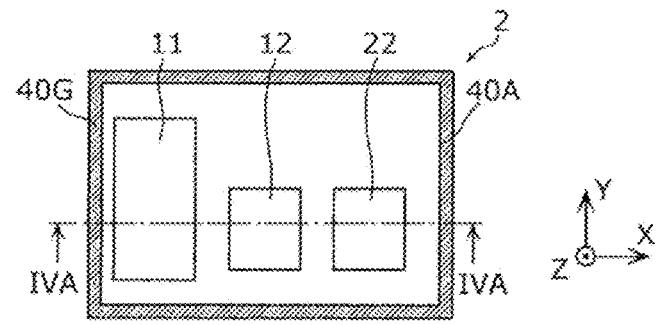
FIG. 4B is a second cross-sectional view (along cut IVB in FIG. 4A) illustrating the configuration of the radio-frequency module according to the first modification.
Figure 4C:
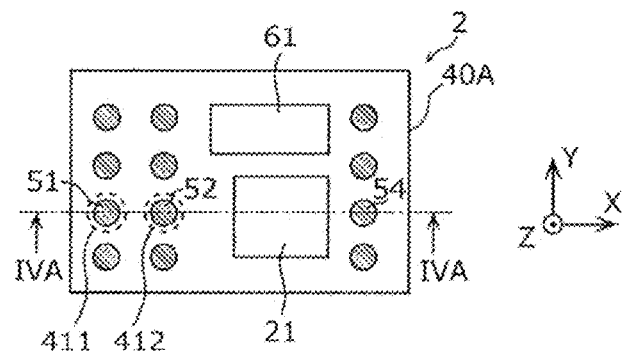
FIG. 4C is a third cross-sectional view (along cut IVC in FIG. 4A) illustrating the configuration of the radio-frequency module according to the first modification.

FIG. 4A is a first cross-sectional view illustrating the configuration of a radio-frequency module 2 according to a first modification. FIG. 4B is a second cross-sectional view illustrating the configuration of the radio-frequency module 2 according to the first modification. FIG. 4C is a third cross-sectional view illustrating the configuration of the radio-frequency module 2 according to the first modification. More specifically, FIG. 4A is a cross-sectional view when a cross section along the IVA-IVA line in FIG. 4B and FIG. 4C is viewed from the Y-axis positive direction. FIG. 4B is a cross-sectional view when a cross section along the IVB-IVB line in FIG. 4A is viewed from the Z-axis negative direction. FIG. 4C is a cross-sectional view when a cross section along the IVC-IVC line in FIG. 4A is viewed from the Z-axis negative direction.

As illustrated in FIG. 4A, the radio-frequency module 2 includes the mounting substrate 30, the PA 11, the LNA 21, the transmission filter 12, the reception filter 22, the resin members 40A and 40B, the through electrodes 51, 52, 53, and 54, the ground terminals 411, 412, and 422, a ground electrode layer 30G, and a shield electrode layer 40G. The radio-frequency module 2 according to the present modification differs from the radio-frequency module 1 according to the embodiment as the configuration in that the ground electrode layer 30G and the shield electrode layer 40G are arranged. A description of the same points of the radio-frequency module 2 according to the present modification as in the radio-frequency module 1 according to the embodiment is omitted and the radio-frequency module 2 according to the present modification will be described, focusing on the points different from the radio-frequency module 1 according to the embodiment.

The ground electrode layer 30G is an electrode layer that is formed of the planar wiring pattern in the mounting substrate 30 and that is set to the ground potential.

The shield electrode layer 40G is a first shield electrode layer that is formed so as to cover the top face and the side faces of the resin member 40A and that is connected to the ground electrode layer 30G at the side faces of the mounting substrate 30.

With the above configuration, it is possible to inhibit the transmission signal from the PA 11 from being directly and externally radiated from the radio-frequency module 2 and it is possible to inhibit external noise from intruding into the circuit components on the main face 30a. In addition, since the heat generated in the PA 11 is capable of being radiated through the shield electrode layer 40G, the heat radiation effect is improved.

4. Configuration of Radio-Frequency Module 3 According to Second Modification

Figure 5A:
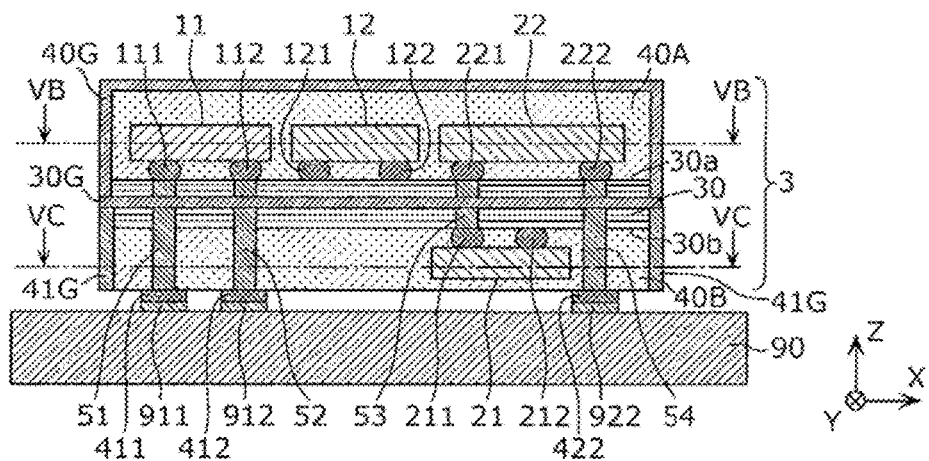
FIG. 5A is a first cross-sectional view (along cut VA in FIGS. 5B and 5C) illustrating a configuration of a radio-frequency module according to a second modification.
Figure 5B:
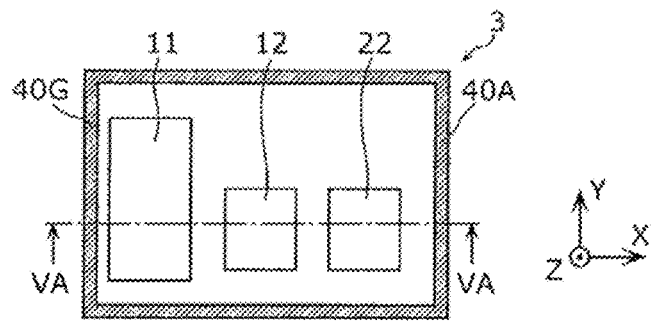
FIG. 5B is a second cross-sectional view (along cut VB in FIG. 5A) illustrating the configuration of the radio-frequency module according to the second modification.
Figure 5C:
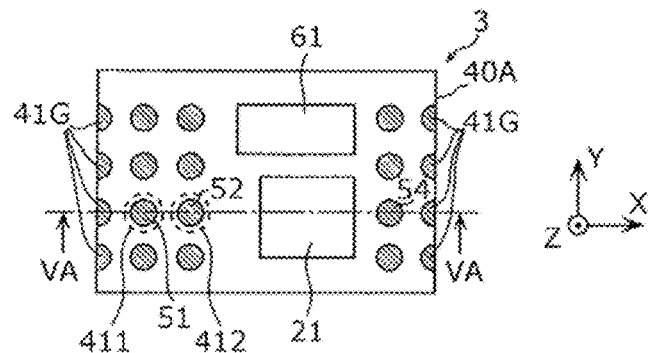
FIG. 5C is a third cross-sectional view (along cut VC in FIG. 5A) illustrating the configuration of the radio-frequency module according to the second modification.

FIG. 5A is a first cross-sectional view illustrating the configuration of a radio-frequency module 3 according to a second modification. FIG. 5B is a second cross-sectional view illustrating the configuration of the radio-frequency module 3 according to the second modification. FIG. 5C is a third cross-sectional view illustrating the configuration of the radio-frequency module 3 according to the second modification. More specifically, FIG. 5A is a cross-sectional view when a cross section along the VA-VA line in FIG. 5B and FIG. 5C is viewed from the Y-axis positive direction. FIG. 5B is a cross-sectional view when a cross section along the VB-VB line in FIG. 5A is viewed from the Z-axis negative direction. FIG. 5C is a cross-sectional view when a cross section along the VC-VC line in FIG. 5A is viewed from the Z-axis negative direction.

As illustrated in FIG. 5A, the radio-frequency module 3 includes the mounting substrate 30, the PA 11, the LNA 21, the transmission filter 12, the reception filter 22, the resin members 40A and 40B, the through electrodes 51, 52, 53, and 54, the ground terminals 411, 412, and 422, the ground electrode layer 30G, the shield electrode layer 40G, and substantially column-shaped shield electrodes 41G. The radio-frequency module 3 according to the present modification differs from the radio-frequency module 2 according to the first modification as the configuration in that the substantially column-shaped shield electrodes 41G are arranged. A description of the same points of the radio-frequency module 3 according to the present modification as in the radio-frequency module 2 according to the first modification is omitted and the radio-frequency module 3 according to the present modification will be described, focusing on the points different from the radio-frequency module 2 according to the first modification.

The substantially column-shaped shield electrodes 41G are a second shield electrode layer that is formed on the side faces of the resin member 40B and that is connected to the ground electrode layer 30G at the side faces of the mounting substrate 30. As illustrated in FIG. 5C, the substantially column-shaped shield electrodes 41G are substantially semi-columnar column-shaped electrodes resulting from cutting in the Z-axis direction of substantially columnar via electrodes passing through the mounting substrate 30 and the resin member 40B in the Z-axis direction. Multiple substantially column-shaped shield electrodes 41G are arranged at the side faces of the resin member 40B.

With the above configuration, since the substantially column-shaped shield electrodes 41G are formed along with the shield electrode layer 40G, the entire radio-frequency module 3 is shielded. Accordingly, it is possible to further inhibit the transmission signal from the PA 11 from being directly and externally radiated from the radio-frequency module 3 and it is possible to inhibit the external noise from intruding into the circuit components on the main faces 30a and 30b. In addition, since the heat generated in the PA 11 is capable of being radiated through the substantially column-shaped shield electrodes 41G, the heat radiation effect is further improved.

The substantially column-shaped shield electrodes 41G may be a layer electrode formed so as to cover the side faces of the resin member 40B, like the shield electrode layer 40G.

5. Configuration of Radio-Frequency Module 4A According to Third Modification

Figure 6:
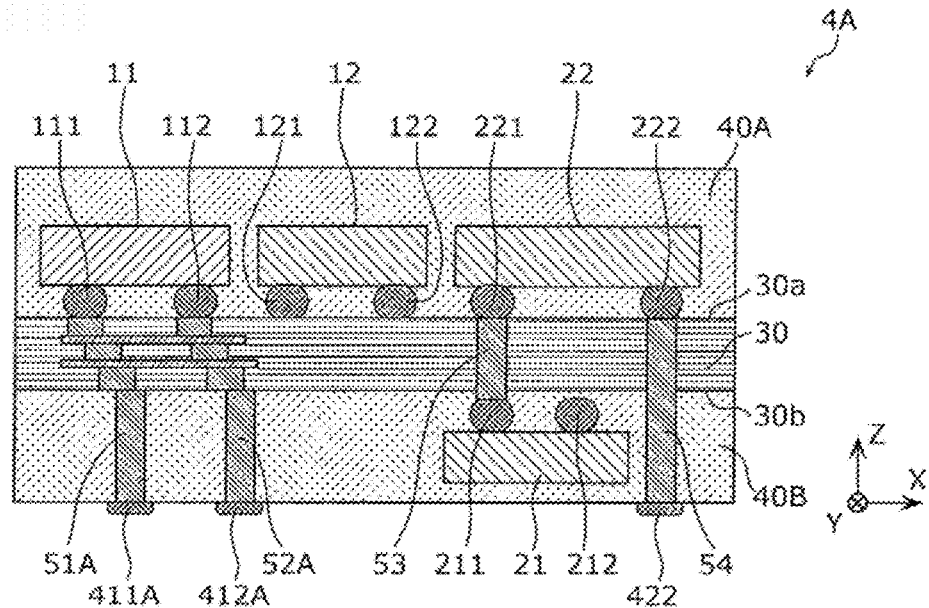
FIG. 6 is a first cross-sectional view illustrating a configuration of a radio-frequency module according to a third modification.

FIG. 6 is a first cross-sectional view illustrating the configuration of a radio-frequency module 4A according to a third modification. As illustrated in FIG. 6, the radio-frequency module 4A includes the mounting substrate 30, the PA 11, the LNA 21, the transmission filter 12, the reception filter 22, the resin members 40A and 40B, through electrodes 51A and 52A, the through electrodes 53 and 54, ground terminals 411A and 412A, and the ground terminal 422. The radio-frequency module 4A according to the present modification differs from the radio-frequency module 1 according to the embodiment in the shapes of the through electrodes 51A and 52A. A description of the same points of the radio-frequency module 4A according to the present modification as in the radio-frequency module 1 according to the embodiment is omitted and the radio-frequency module 4A according to the present modification will be described, focusing on the points different from the radio-frequency module 1 according to the embodiment.

The through electrode 51A is an electrode that electrically connects the emitter terminal 111 to the ground terminal 411A and that passes through the mounting substrate 30 from the main face 30a to the main face 30b. The through electrode 52A is an electrode that electrically connects the emitter terminal 112 to the ground terminal 412A and that passes through the mounting substrate 30 from the main face 30a to the main face 30b.

Here, the through electrode 51A is not composed of one substantially cylindrical via electrode extending from the main face 30a to the main face 30b in the mounting substrate 30 and has a structure in which multiple substantially cylindrical via electrodes are connected in series to each other. The planar wiring patterns along the respective layers are formed between the multiple substantially cylindrical via electrodes connected in series to each other and the substantially cylindrical via electrodes adjacent to each other in the Z-axis direction are at least partially overlapped with each other in a plan view of the main face 30b from the main face 30a. In other words, no path in the XY plane direction only through the planar wiring pattern exists in the through electrode 51A and the path in the Z-axis direction exists in the through electrode 51A. The through electrode 52A has the same structure as that of the through electrode 51A.

With the above configuration, the emitter terminal 111 is not limitedly overlapped with the ground terminal 411A in the above plan view due to the through electrode 51A and it is possible to increase the degree of freedom of the arrangement of the ground terminal 411A. In addition, the emitter terminal 112 is not limitedly overlapped with the ground terminal 412A in the above plan view due to the through electrode 52A and it is possible to increase the degree of freedom of the arrangement of the ground terminal 412A. Furthermore, for example, the size (diameter) of the multiple substantially cylindrical via electrodes may be changed and multiple substantially cylindrical via electrodes may be provided in the same layer to enable further decrease of the thermal resistance on the heat radiation path.

6. Configuration of Radio-Frequency Module 4B According to Fourth Modification

Figure 7:
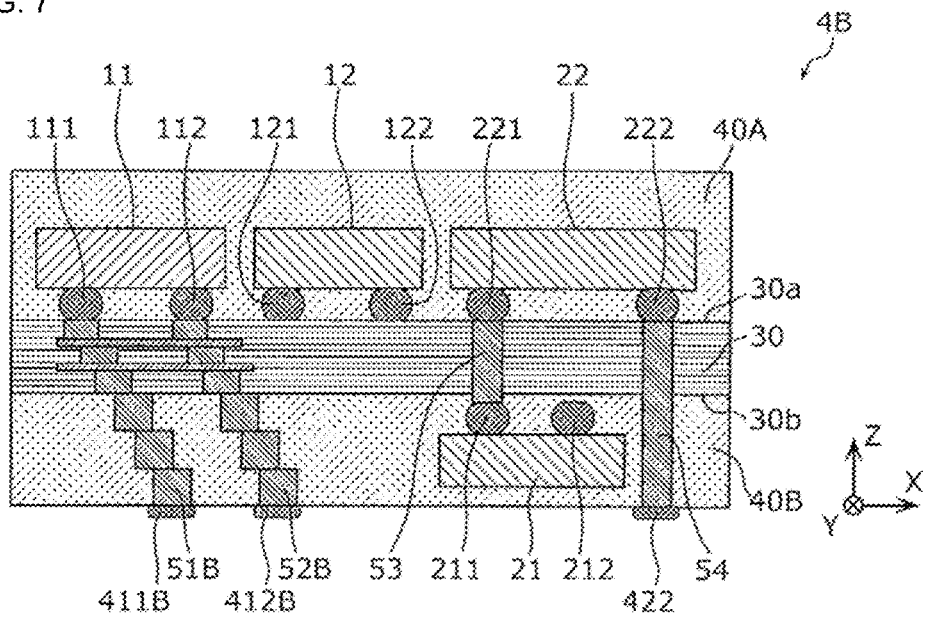
FIG. 7 is a first cross-sectional view illustrating a configuration of a radio-frequency module according to a fourth modification.

FIG. 7 is a first cross-sectional view illustrating the configuration of a radio-frequency module 4B according to a fourth modification. As illustrated in FIG. 7, the radio-frequency module 4B includes the mounting substrate 30, the PA 11, the LNA 21, the transmission filter 12, the reception filter 22, the resin members 40A and 40B, through electrodes 51B and 52B, the through electrodes 53 and 54, ground terminals 411B and 412B, and the ground terminal 422. The radio-frequency module 4B according to the present modification differs from the radio-frequency module 1 according to the embodiment in the shapes of the through electrodes 51B and 52B. A description of the same points of the radio-frequency module 4B according to the present modification as in the radio-frequency module 1 according to the embodiment is omitted and the radio-frequency module 4B according to the present modification will be described, focusing on the points different from the radio-frequency module 1 according to the embodiment.

The through electrode 51B is an electrode that electrically connects the emitter terminal 111 to the ground terminal 411B and that passes through the mounting substrate 30 from the main face 30a to the main face 30b. The through electrode 52B is an electrode that electrically connects the emitter terminal 112 to the ground terminal 412B and that passes through the mounting substrate 30 from the main face 30a to the main face 30b.

Here, the through electrode 51B is not composed of one substantially cylindrical via electrode extending from the main face 30a to the main face 30b and has a structure in which multiple substantially cylindrical via electrodes are connected in series to each other in the mounting substrate 30. The through electrode 51B has a structure in which multiple substantially cylindrical via electrodes are connected in series to each other in the resin member 40B. The planar wiring patterns along the respective layers are formed between the multiple substantially cylindrical via electrodes in the mounting substrate 30.

In a plan view of the main face 30b from the main face 30a, the substantially cylindrical via electrodes adjacent to each other in the Z-axis direction are at least partially overlapped with each other in both the mounting substrate 30 and the resin member 40B. In other words, no path in the XY plane direction only through the planar wiring pattern exists in the through electrode 51B and the path in the Z-axis direction exists in the through electrode 51B. The through electrode 52B has the same structure as that of the through electrode 51B.

With the above configuration, the emitter terminal 111 is not limitedly overlapped with the ground terminal 411B in the above plan view due to the through electrode 51B and it is possible to increase the degree of freedom of the arrangement of the ground terminal 411B. In addition, the emitter terminal 112 is not limitedly overlapped with the ground terminal 412B in the above plan view due to the through electrode 52B and it is possible to increase the degree of freedom of the arrangement of the ground terminal 412B. Furthermore, for example, the size (diameter) of the multiple substantially cylindrical via electrodes may be changed and multiple substantially cylindrical via electrodes may be provided in the same layer to enable further decrease of the thermal resistance on the heat radiation path.

In the embodiment, the example, and the modifications described above, although the through electrode passes through not only the mounting substrate 30 but also the resin member 40B, the through electrode may be formed across the main face 30a and the main face 30b and the through electrode may be connected to the external connection terminal on the main face 30b. For example, in the cross-sectional view of the radio-frequency module 1A illustrated in FIG. 3A, among the through electrodes 51 and 52, the portions formed in the mounting substrate 30 may be the through electrodes and the portions formed in the resin member 40B may be the external connection terminals, which are members different from the through electrodes.

In other words, the radio-frequency module according to an embodiment of the present disclosure may include a mounting substrate 30 which has main faces 30a and 30b and in which radio-frequency components are capable of being mounted on the main faces 30a and 30b, a PA 11 mounted on the main face 30a, a through electrode that is connected to the PA 11 and that passes through the mounting substrate 30 between the main face 30a and the main face 30b, and an external connection terminal that is formed on the main face 30b and that is connected to the through electrode.

With the above configuration, since the circuit components are mounted on both of the mounting faces of the mounting substrate, it is possible to increase the density and reduce the size, compared with a radio-frequency module using the single-side mounted substrate. In addition, since the PA 11 having a high heating value is mounted on the main face 30a and the PA 11 is connected to the external connection terminal with the through electrode formed in the mounting substrate 30, the heat radiation path only through the planar wiring pattern having high thermal resistance, among the lines in the mounting substrate 30, is capable of being excluded. Accordingly, it is possible to provide the compact radio-frequency module having improved heat radiation effect from the PA 11 to the external substrate 90.

The external connection terminal may be, for example, a substantially column-shaped electrode that is arranged on the main face 30b and that extends in a normal direction of the main face 30b in the resin member 40B.

The external connection terminal may be a bump electrode arranged on the main face 30b. In this case, the resin member 40B is not arranged.

The external connection terminal may be connected to the external substrate.

In a plan view of the mounting substrate 30, the through electrode may be at least partially overlapped with the external connection terminal.

With the above configuration, since the PA 11 is capable of being connected to the external connection terminal with a substantially minimum distance and the thermal resistance on the heat radiation path from the PA 11 is capable of being decreased, it is possible to further improve the heat radiation effect from the PA 11 to the external substrate 90. In addition, since the area in which the external connection terminal is formed at the main face 30b is capable of being limited to an area almost immediately below the PA 11, it is possible to increase the area in which the circuit component mounted on the main face 30b is formed. Accordingly, the degree of freedom of the arrangement of the circuit component is improved.

Other Embodiments and so on

Although the radio-frequency modules and the communication apparatus according to the embodiments of the present disclosure are described above, the radio-frequency module and the communication apparatus according to the embodiments of the present disclosure are not limited to the embodiments described above. Other embodiments realized by combining arbitrary components in the above embodiments, modifications realized by making various changes supposed by a person skilled in the art to the above embodiments without departing from the spirit and scope of the present disclosure, and various devices including the radio-frequency module and the communication apparatus are also included in the present disclosure.

For example, in the radio-frequency modules and the communication apparatus according to the embodiments described above, other circuit elements, lines, and so on may be provided between the paths connecting the respective circuit elements and the signal paths disclosed in the drawings.

The present disclosure is widely usable for a communication device, such as a mobile phone, as a radio-frequency module arranged in a multiband front end unit.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:
1. A radio-frequency module comprising:
a mounting substrate having a first face and a second face, which is opposed to the first face;
a transmission power amplifier mounted on the first face, the transmission power amplifier including an emitter terminal;
an electrode connected to the emitter terminal of the transmission power amplifier, wherein the electrode passes through the mounting substrate between the first face and the second face;
a ground terminal connected to the electrode; a low noise reception amplifier mounted on the second face; a transmission filter mounted on the first face and connected to the transmission power amplifier;
a reception filter mounted on the first face and connected to the low noise reception amplifier; and
a first switch mounted on the second face, and having a common terminal connected to a common input-output terminal, a first selection terminal connected to the transmission filter, and a second selection terminal connected to the reception filter, wherein
in a plan view of the radio-frequency module in a direction vertical to the first face, the electrode at least partially overlaps the ground terminal and does not overlap the low noise reception amplifier, transmission filter, the reception filter and the first switch.
2. The radio-frequency module of claim 1, wherein
the radio-frequency module is connected to an external substrate, and
the ground terminal is connected to the external substrate.
3. The radio-frequency module of claim 1, further comprising:
first resin formed on the first face that covers at least part of the transmission power amplifier.
4. The radio-frequency module of claim 3, further comprising:
second resin formed on the second face that covers at least part of the low noise reception amplifier.
5. The radio-frequency module of claim 4, wherein
the ground terminal is arranged on the second resin.
6. The radio-frequency module of claim 5, further comprising:
a ground electrode layer formed of a planar wiring pattern in the mounting substrate; and
a first shield electrode layer formed to cover a top face and side faces of the first resin and connected to the ground electrode layer at side faces of the mounting substrate.

7. The radio-frequency module of claim 5, further comprising:
- a second shield electrode layer formed on side faces of the second resin and connected to the ground electrode layer at the side faces of the mounting substrate.

8. The radio-frequency module of claim 1, wherein
in a plan view of the radio-frequency module in a direction vertical to the first face and the second face, a footprint of the electrode at least partially overlaps with a footprint of the ground terminal.

9. The radio-frequency module of claim 1, wherein
in a plan view of the radio-frequency module in a direction vertical to the first face and the second face, a footprint of the transmission power amplifier does not overlap with a footprint of the low noise reception amplifier.

10. The radio-frequency module of claim 1,
wherein
in a plan view of the radio-frequency module in a direction vertical to the first face and the second face, a footprint of the low noise reception amplifier at least partially overlaps with a footprint of the reception filter.

11. The radio-frequency module of claim 1, wherein
in a plan view of the radio-frequency module in a direction vertical to the first face and the second face, a footprint of the low noise reception amplifier mounted on the second face at least partially overlaps with a footprint of the reception filter.

12. A radio-frequency module comprising:
a mounting substrate including a first face and a second face, which opposes the first face;
a transmission power amplifier arranged on the first face;
an electrode connected to the transmission power amplifier and that passes through the mounting substrate between the first face and the second face; and
an external connection terminal arranged on the second face and connected to the electrode;
a low noise reception amplifier mounted on the second face;
a transmission filter mounted on the first face and connected to the transmission power amplifier; and
a reception filter mounted on the first face and connected to the low noise reception amplifier; and
a first switch mounted on the second face, and having a common terminal connected to a common input-output terminal, a first selection terminal connected to the transmission filter, and a second selection terminal connected to the reception filter, wherein
in a plan view of the radio-frequency module in a direction vertical to the first face, the electrode at least partially overlaps the ground terminal and does not overlap the low noise reception amplifier, transmission filter, the reception filter and the first switch.

13. The radio-frequency module of claim 12, wherein
the radio-frequency module is connected to an external substrate, and
the external connection terminal is connected to the external substrate.

14. The radio-frequency module of claim 12, wherein
in a plan view of the radio-frequency module in a direction vertical to the first face and the second face, a footprint of the electrode at least partially overlaps with a footprint of the external connection terminal.

15. A communication apparatus comprising:
an external substrate; and
a radio-frequency module comprising
a mounting substrate having a first face and a second face, which is opposed to the first face;
a transmission power amplifier mounted on the first face, the transmission power amplifier including an emitter terminal;
an electrode connected to the emitter terminal of the transmission power amplifier, wherein the electrode passes through the mounting substrate between the first face and the second face; and
a ground terminal connected to the electrode;
a low noise reception amplifier mounted on the second face;
a transmission filter mounted on the first face and connected to the transmission power amplifier;
a reception filter mounted on the first face and connected to the low noise reception amplifier; and
a first switch mounted on the second face, and having a common terminal connected to a common input-output terminal, a first selection terminal connected to the transmission filter, and a second selection terminal connected to the reception filter, wherein
in a plan view of the radio-frequency module in a direction vertical to the first face, the electrode at least partially overlaps the ground terminal and does not overlap the low noise reception amplifier, transmission filter, the reception filter and the first switch.

16. The communication apparatus of claim 15, wherein
in a plan view of the communication apparatus from a direction vertical to the first face and the second face, a footprint of the external ground electrode at least partially overlaps with a footprint of the electrode.

17. The communication apparatus of claim 15, wherein
the radio-frequency module is connected to an external substrate, and
the ground terminal is connected to the external substrate.

18. The communication apparatus of claim 15, wherein
the radio-frequency module comprises a first resin formed on the first face that covers at least part of the transmission power amplifier.

* * * * *